(12) United States Patent
Pruett

(10) Patent No.: US 6,890,986 B2
(45) Date of Patent: May 10, 2005

(54) SUBSTANTIALLY PURE BULK PYROCARBON AND METHODS OF PREPARATION

(75) Inventor: James Gary Pruett, Cypress, CA (US)

(73) Assignee: Hitco Carbon Composites, Inc., Gardena, CA (US)

( * ) Notice: Subject to any disclaimer, the term of this patent is extended or adjusted under 35 U.S.C. 154(b) by 507 days.

(21) Appl. No.: 09/940,901

(22) Filed: Aug. 28, 2001

(65) Prior Publication Data

US 2002/0037247 A1 Mar. 28, 2002

Related U.S. Application Data

(60) Provisional application No. 60/228,883, filed on Aug. 29, 2000.

(51) Int. Cl.$^7$ ................................. C08K 3/04
(52) U.S. Cl. ................... 524/495; 524/403; 524/496; 423/445 R; 423/447.1; 423/447.2; 423/447.3; 423/448; 423/460
(58) Field of Search .................. 423/445 R, 447.1, 423/447.2, 447.3, 448, 460; 524/495, 403, 496

(56) References Cited

U.S. PATENT DOCUMENTS

| | | | |
|---|---|---|---|
| 3,977,896 A | 8/1976 | Bokros et al. | |
| 4,013,760 A | 3/1977 | Huschka et al. | |
| 4,663,230 A | 5/1987 | Tennent | |
| 4,796,701 A | 1/1989 | Hudson et al. | |
| 5,254,262 A | 10/1993 | Funkenbusch et al. | |
| 5,344,726 A | * 9/1994 | Tanaka et al. | ............... 429/209 |
| 5,374,415 A | * 12/1994 | Alig et al. | ............... 423/447.3 |
| 5,552,220 A | 9/1996 | Goujard et al. | |
| 5,594,060 A | 1/1997 | Alig et al. | |
| 5,691,054 A | 11/1997 | Tennent et al. | |

FOREIGN PATENT DOCUMENTS

EP     1120842 A1    8/2001

* cited by examiner

Primary Examiner—Edward J. Cain
(74) Attorney, Agent, or Firm—Curatolo Sidoti Co., LPA; Joseph G. Curatolo; James E. Oehlenschlager

(57) ABSTRACT

The present invention provides a substantially pure and finely divided granular pyrolytic carbon material. The substantially pure pyrolytic carbon can be used in a variety of applications including filtration and battery electrode applications. The present invention further describes a process for producing a substantially pure pyrolytic carbon material that includes heating a mixture of refractory inorganic particles with hydrocarbon gas for an amount of time sufficient to deposit a substantially uniform layer of pyrolytic carbon on the surfaces of the particles.

41 Claims, No Drawings

SUBSTANTIALLY PURE BULK PYROCARBON AND METHODS OF PREPARATION

CROSS REFERENCE TO RELATED APPLICATIONS

The present application claims the benefit of the filing date, under 35 U.S.C. §119(e), of U.S. Provisional Application Ser. No. 60/228,883, filed Aug. 29, 2000.

TECHNICAL FIELD OF THE INVENTION

The present invention generally relates to a method for producing large bulk quantities of substantially pure granular pyrolytic carbon material. The present invention more particularly relates to a method for producing bulk quantities of substantially pure pyrolytic carbon utilizing a high surface area inorganic particulate material and a hydrocarbon gas in an efficient and cost effective manner.

BACKGROUND OF THE INVENTION

Pyrolytic carbon can be produced by conventional chemical vapor deposition processes to form a variety of carbon microstructures. This process has been used to produce nuclear fuel encapsulation pellets, highly oriented pyrolytic graphite, high purity pyrolytic protective coatings on graphite objects, pyrolytic carbon matrix in fiber reinforced composites, pyrolytic coatings on prostheses, and as interface layers between ceramic fibers and ceramic matrix in ceramic composites.

These processes have usually been found to be expensive and time consuming and, therefore, used as a value-added process to enhance the properties of the bulk material under development. The use of pyrolytic carbon as a bulk material for making other materials, such as filled rubbers, filled plastics, carbided metals, electrode structures, reinforcements, and in general any use which is common for other granular forms of carbon such as granular pitch, graphite powders, mesophase powders, carbon nanofibers, milled carbon fibers, granular activated carbons, and carbon blacks is severely restricted, because there has been no viable method for a low cost and high volume production of the pyrocarbon in a pure and finely divided form. As a result, some of the intrinsic properties of the material, which could be useful as a bulk material or raw material for other manufacturing steps, have not been exploited.

It is known in the art that pyrolytic carbon can be coated onto other objects for the enhancement of their qualities. U.S. Pat. No. 5,552,220, for example, teaches that specific carbon structures can be formed between the fibers in a matrix to create a composite material.

U.S. Pat. No. 4,796,701 teaches that a pyrolytic carbon coating on gravel can be used for drilling bed packings, and can enhance the packing efficiency of the gravel.

U.S. Pat. No. 3,977,896 teaches that objects can be suspended within a fluidized bed within a reactor designed to deposit a pyrolytic carbon coating on the objects of interest.

All of these references disclose that the process is viable when some high added value to the object or material is produced with a relatively small addition of the pyrolytic carbon material. This is primarily due to the fact that since the thickness deposition rate of the pyrocarbon deposition is quite small, only relatively small quantities of the pyrolytic carbon can be produced in an economical manner.

U.S. Pat. No. 4,013,760 teaches that large granular carbon materials with sizes greater than 100 microns can be coated with pyrolytic carbon and then milled or ground to create a finer granular material containing some pure pyrolytic carbon mixed with the original granular carbon.

Despite the above teachings of the prior art, none of the references provide a means of producing large quantities of substantially pure pyrolytic carbon directly in a very fine granular form.

SUMMARY OF THE INVENTION

It is, therefore, an object of the present invention to provide a substantially pure pyrolytic carbon.

It is another object of the present invention to provide a method for the bulk production of large quantities of substantially pure and finely divided pyrolytic carbon material.

The foregoing objects, together with the advantages thereof over the known art relating to methods of producing pyrolytic carbon and uses thereof, which shall become apparent from the specification which follows, are accomplished by the invention as hereinafter described and claimed.

The present invention, therefore, provides a substantially pure and finely divided pyrolytic carbon.

The present invention further includes a method of preparing a substantially pure and finely divided pyrolytic carbon comprising: providing inorganic particles having a surface area greater than about 10 $m^2/g$; exposing the inorganic particles to a hydrocarbon gas; and heating the inorganic particles and hydrocarbon gas for a time sufficient to deposit a substantially uniform layer of pyrolytic carbon on the particles.

In one embodiment, the layer of pyrolytic carbon coating is at least five times greater than the smallest dimension of said organic particles.

DETAILED DESCRIPTION OF THE INVENTION

The present invention describes a low cost and efficient process for the production of large quantities of substantially pure and finely divided pyrolytic carbon. The terms "pyrolytic carbon" and "pyrocarbon", as used throughout the specification, can be used interchangeably and refer to carbon that is substantially uniformly deposited on the surfaces of refractory inorganic particles.

The present invention takes advantage of the new availability of ultra-fine refractory inorganic particles, which I have found exhibit a very high surface area to volume ratio as a "seed" particle on which to deposit pyrolytic carbon. Depositing pyrolytic carbon on inorganic particles having a high surface area results in extremely high mass deposition rates per unit volume of starting material within a short period of deposition.

The refractory inorganic seed particle becomes an insignificant fraction of the whole amount of pyrolytic carbon deposited on the surfaces on the particle. The process of the present invention, therefore, serves the dual purpose of economically producing very large quantities of bulk pyrocarbon in a short period of time, and doing so in a manner that no significant additional materials or contaminants are present in the final pyrolytic carbon produced according to the present invention.

In general, the process for producing the substantially pure pyrolytic carbon comprises providing inorganic particles having a surface area greater than about 10 $m^2/g$. The inorganic particles are exposed to or mixed with a suitable hydrocarbon gas to form a mixture. The mixture of inorganic particles and hydrocarbon gas are heated for a time sufficient to deposit a substantially uniform layer of pyrolytic carbon on the surfaces of the inorganic particles.

In one preferred embodiment, the substantially uniform layer of pyrolytic carbon is at least five times greater than the smallest dimension of the particle onto which it is deposited. In another preferred embodiment, the substantially uniform layer of pyrolytic carbon is at least ten times greater than the smallest dimension of the particle onto which it is deposited.

The process of the present invention may utilize any form of refractory inorganic particles including, but not limited to, ultra-fine powders or particulates, aerogels, whiskers, exfoliated flakes, or any other morphological form having a surface area exceeding 10 $m^2/g$. More preferably, the refractory inorganic particles of the present invention have a surface area greater than about 50 $m^2/g$.

The refractory inorganic particles suitable for use in the process of the present invention include, but are not limited to, carbon particles and ceramic particles.

Preferably, the refractory inorganic particles are inorganic whiskers. The term "whiskers" includes any one of "fibrils", "nanofibers", "fibroids", "nanotubes", "buckytubes", and the like, being various fiber-like structures having very small diameters and a high surface area to volume ratio. The inorganic particles generally have diameters less than 1 micron, preferably less than 0.5 microns, more preferably less than 0.1 micron and most preferably less than 0.05 microns.

The inorganic particles employed in the present invention are generally from about 3 to about 5000 microns in length, more preferably about 5 to about 2000 microns in length, and most preferably from about 5 to about 300 microns in length.

In contrast to the fiber-like inorganic particles used in the present invention, conventional inorganic fibers are generally from about 1 to about 15 millimeters in length, more preferably from about 5 to about 10 millimeters in length, and are generally from about 3 microns to about 20 microns in diameter, preferably about 5 to about 12 microns in diameter. Traditionally, pyrolytic carbon has been deposited on conventional inorganic fibers having a surface area of only less than 0.5 $m^2/g$. According to the methods of the present invention, however, using inorganic particles, such as whiskers or nanofibers, that have a high surface area allows for the deposition of much greater amounts of pyrolytic carbon on the particle.

Any inorganic whisker having a surface area greater than about 10 $m^2/g$ may be used in the present invention for the deposition of pyrolytic carbon thereon. In general, the inorganic particles useful in the present invention are inorganic whiskers, and include carbon whiskers and ceramic whiskers. The most preferred whiskers used in the present invention are carbon whiskers. Suitable carbon whiskers for use in the process of the present invention, are vapor grown carbon whiskers having an average diameter from about 0.1 to about 0.2 microns, such as those prepared the method disclosed by U.S. Pat. No. 5,594,060 (Alig et al.)

Although vapor grown carbon whiskers are particularly useful in the process, the present invention is not limited only to the above mentioned vapor grown carbon whiskers and, thus, other types of carbon fibrils, filaments, fibroids, whiskers, microfibers and nanofibers meeting the composition and sizes defined above, including but not limited to those prepared by the methods disclosed by U.S. Pat. No. 5,374,415 (Alig et al.), U.S. Pat. No. 5,691,054 (Tennent et al) and U.S. Pat. No. 4,663,230 (Tennent) may comprise the carbon whisker component of the process of the present invention.

In one preferred embodiment of the present invention, the carbon particles are vapor grown carbon nanofibers (whiskers) or carbonized polymer nanofibers (whiskers) having a diameters less than 1 micron, preferably less than 0.2 microns and most preferably less than 0.05 microns. Most preferably, the carbon particles utilized in the present invention are vapor grown carbon nanofibers.

In another embodiment of the present invention, the refractory inorganic particles are ceramic whiskers. The ceramic whiskers that may be used in the present invention include, but are not limited to, silicon carbide, silicon nitride, titanium carbide, titanium nitride, silica, alumina, zirconia, ceria and glass whiskers. Preferably, the ceramic whiskers that are used in the present invention are silicon carbide whiskers.

According the process of the present invention, the refractory inorganic particles are introduced into a heated zone of a suitable reaction vessel or chamber, such as a furnace, and exposed to or mixed with a process gas. The process gas utilized in the present invention is comprised at least partially of a hydrocarbon gas. Useful hydrocarbon gases include alkanes, such as methane, ethane, propane, and butane, alkenes, such as ethylene, propylene, and butylene, alkynes, such as acetylene, aromatic hydrocarbons and mixtures thereof.

In one preferred embodiment, the process gas utilized in the present invention is natural gas. Natural gas is a colorless mixture of hydrocarbon gases, and usually comprises methane, ethane, propane, butane and nitrogen.

In general, the starting refractory inorganic particles are brought into contact with the selected hydrocarbon gas in a manner such that the hydrocarbon gas is able to fully mix with the ultra-fine inorganic particles.

Without intending to be limited thereto, the pyrolytic carbon can be deposited on the inorganic particles by means of a fluidized bed process vessel, a circulating or recirculating entrained flow process vessel, a packed bed process vessel in which the gas is able to flow or diffuse through the material and packed to a volume density sufficient to allow the desired deposition to occur without forming a substantially dense solid body, or a process utilizing at least one of a moving tray, powder screw transporter, or belt system with a sample of the material carried into and out of the reaction zone.

In a fluidized bed process, finely divided particulates are suspended or levitated by a moving gas or liquid. With specific application to the present invention, a fluidized bed process may be used, by which a bed of the refractory inorganic particles are placed in a vertical column and process gas is flowed through the bed from the bottom of the column. The process gas moves or suspends the particles upward and further apart in the vertical column and, upon heating, pyrolytic carbon is deposited on the refractory inorganic particles.

Entrainment is the process in which particulates are picked up in and carried away by a flowing gas or liquid. In general, entrainment of particulates occurs when the velocity of the gas or liquid is greater than the settling velocity of the particulates. In a circulating or recirculating entrained flow process, the refractory inorganic particles are placed in a reaction vessel, such as a process pipe. Process gas is flowed through the reaction pipe, and the refractory inorganic particles are caught in the process gas and are carried into a heated "reaction zone" of the reaction pipe by the flowing process gas. Pyrolytic carbon is deposited on the refractory inorganic particles in the heated reaction zone of the reaction chamber.

In one preferred embodiment, a fixed bed of appropriately packed refractory inorganic particles is provided, through which the hydrocarbon gas is forced to flow. A packed bed process vessel generally includes a chamber that is packed with solid particulates. The solid particulates are supported by a base plate located near the bottom of the packed bed process vessel. The hydrocarbon gas is flowed through the entire fixed bed without substantial diversion through regions which contain a significantly lower density of the refractory particles, and the pyrolytic carbon is substantially uniformly deposited on the surfaces of the refractory inorganic particles.

According to the present invention, the reaction chamber or vessel is generally heated to a temperature range of about 500° C. to about 1700° C., preferably in a range from about 900° C. to about 1100° C. and more preferably from about 950° C. to about 1050° C., depending on the volumetric flow quantity and identity of the hydrocarbon gas.

In one preferred embodiment, natural gas is utilized as the hydrocarbon gas and the reaction chamber is heated a temperature in the range of about 900° C. to about 1200° C.

The refractory inorganic particles are allowed to be exposed to, or otherwise are disposed in contact with, the reactive hydrocarbon gas in the hot zone of the reaction chamber for a sufficient amount of time to deposit or grow a substantially uniform layer of pyrolytic carbon on the surfaces of the inorganic particles that is at least 5 times greater than the smallest dimension of an individual particle. Preferably, a substantially uniform layer of pyrolytic carbon on the surfaces of the inorganic particles is grown that is at least 10 times greater than the smallest dimension of the particle.

After the substantially uniform layer of pyrolytic carbon has been deposited on the surfaces of the refractory inorganic particles, then the particles are removed from the reaction vessel in such a way as to prevent contact with air while it is above 500° C.

The process conditions of the present invention can be tailored to achieve any desired property of the pyrocarbon material, ranging from highly oriented graphitic layers to nearly amorphous and glassy carbon.

Highly oriented pyrolytic graphite can be produced according to the methods of the present invention, for example, by controlling the reaction temperature, gas flow and gas composition to allow relatively slow deposition, such as at lower temperatures and using carbon sources containing a higher percentage of aromatic bonding, such as acetylene or benzene. Such highly oriented graphitic granules are useful for applications requiring high electrical conductivity or thermal conductivity, or for applications in electrode structures such as in intercalated $Li^+$ battery electrode structures.

Amorphous or glassy carbon material can be formed, for example, by depositing the carbon at higher temperatures, and/or by using carbon sources containing little or no aromatic bonding, such as in pure methane, or other normal alkanes. The term "amorphous", as used in this specification, refers to a carbon material that does not possess the crystalline order that is normally associated with a solid state of matter. The initial compacted density of the precursor material may be selected such that following deposition of the pyrocarbon on the "seed" particles, the final density of the compacted material is sufficiently low, for use as a bulk particulate material rather than a densified mass, preferably between about 0.1 and about 1.6 grams per cubic centimeter.

The substantially pure pyrolytic carbon material produced by the present invention can then be lightly pulverized by mechanical or ultrasonic means, resulting in a powder consisting of at least 95% pyrolytic carbon, and more preferably at least 99% pyrolytic carbon in finely divided form having at least one dimension below 10 microns, and more preferably at least one dimension below 3 microns.

Various forms of carbon materials in powdered, flake, or granular form are used as modifiers and fillers in formulations of plastics, rubbers, electrodes, and in fiber reinforced composites.

The substantially pure and finely divided pyrocarbon material can be produced in any of the wide range of pyrocarbon microstructure types, including rough laminar, smooth laminar, and isotropic microstructures.

The term "rough laminar" refers to a carbon microstructure, which when examined under polarized light with observation through a polarizing filter (which blocks the illuminating polarization), indicates a significant long range order in the alignment of the graphite planes of the crystalline graphite components, exhibits at least a few sharp grain boundaries of differently oriented graphite planes, and, with sufficient heat treatment, can attain an intrinsic thermal conductivity in at least one direction in excess of about 500 W/mK.

In the rough laminar form, the material can be further heat treated to produce a high quality graphitic granular material useful for applications requiring high electrical or thermal conductivity, such as fillers in rubbers and thermoplastics, as fillers in friction materials, or in applications requiring ordered graphite planes for ion intercalation such as in $Li^+$ battery electrodes. In an electrode for a Lithium Ion rechargeable battery, the primary charge storage mechanism is in the form of the intercalation of the Lithium ion into a graphite crystal host. Because one type of pyrocarbon microstructure, namely rough laminar pyrocarbon, is known to easily graphitize to form high purity graphite structures, the combination of controlled particulate size and controlled pyrocarbon structure is a useful property for the formulation of lithium ion batteries.

An electrode structure for batteries is often compounded from carbon materials to enhance its electrical conductivity to reduce internal voltage drop during discharge. The finely divided and substantially pure pyrocarbon material of the present invention is also useful to improve the electrical conductivity of battery electrodes. In this case, various carbon containing materials are mixed with a binder material and other necessary ingredients for the type of battery desired, then molded and further processed if necessary to achieve a final article. The type and morphology of the carbon material is important in achieving the desired processability and the desired final electrical and physical properties of the electrode structure. Thus, a finely divided pyrocarbon material would be expected to be a useful filler for this application.

The substantially pure and finely divided pyrocarbon material having a rough laminar carbon microstructure, prepared according to the methods of the present invention, is particularly useful to prepare electrodes for fuel cell applications. A fuel cell electrode having a high thermal conductivity can be prepared by molding an article from a mixture of the substantially pure and finely divided pyrocarbon material and an appropriate of binder.

In an electrode structure for a fuel cell, particularly for the portion of the fuel cell known as the bipolar plate, the current flow in the electrode is restricted if the plate electrical conductivity is low. Low cost bipolar plates are manufactured using a low cost rapid forming technique such as molding or stamping. To achieve these processing goals, the formulation may include electrically insulating plastic or thermoplastic binders and, therefore, must include electrically conductive fillers in order to maintain the system electrical conductivity. The selection of the appropriate filler from the choices available is based on multiple criteria other than electrical conductivity, such as thermal expansion, thermal shock stability, etc. The finely divided and substantially pure pyrocarbon material of the present invention is electrically conductive and, therefore, is particularly useful as a filler material for the manufacture of fuel cell electrodes.

Additionally, plastic articles can be rendered thermally or electrically conductive, or both, with the mixing of a moderate percentage of carbon in the form of carbon fibers, graphite powders, or other carbon forms. The finely divided and substantially pure pyrocarbon material of the present invention is also useful to render a plastic article thermally or electrically conductive. In this case, a master batch of plastic material is made containing a high percentage of the filler material, and is then blended down to a lower percentage with additional amounts of the same or compatible plastic prior to forming an article from the final composition. The form of the carbon containing filler is often carefully selected in order to obtain the desired final properties of the material. Properties other than the primary intended benefit are often considered, such as the surface finish properties of an article primarily intended to have a particular thermal or electrical conductivity. It is therefore important to the plastics compounder to have at his disposal a variety of potential filler materials so that formulation of the final article can be used to optimize its properties. The availability of another basic type of dense carbon powder in the form of powdered or fine granular pyrolytic carbon is therefore of advantage for this application.

In rubber materials, the final desired properties of the article include, for example, pliability, abrasion resistance, hardness, temperature stability, friction properties and the like. These properties are achieved in the industry by not only mixing rubber compositions, but also by adding fillers to the rubber composition to affect these target properties. When low mass and high thermal or electrical properties are desired, carbon materials are most often the engineering material selected. As in plastics formulations, various forms of carbon are often used in these applications. The finely divided pyrocarbon materials of the present invention have significantly different properties than the other carbon materials available. For example, pyrocarbons can be made highly graphitizable and heat treated in order to achieve high thermal and electrical conductivity. The finely divided pyrocarbon form is also beneficial in that it exhibits good mixing characteristics with the rubber, which results in a uniform rubber composition.

The term "smooth laminar" refers to a carbon microstructure which exhibits some long range order resulting in rotation of the plane of polarization of the illuminating light, but the carbon microstructure does not exhibit the characteristic sharp grain boundaries of the rough laminar carbon microstructure. After sufficient heat treatment, carbon material having a smooth laminar carbon microstructure has an intrinsic thermal conductivity in at least one direction of less than about 500 W/mK.

In smooth laminar and isotropic form, the pyrolytic carbon material can be used in applications requiring more brittle carbons, such as in friction applications, or carbons which can be oxidized to produce high surface area carbons for filtration and purification applications.

The term "isotropic" refers to refers to a carbon material having a carbon microstructure that exhibits little or no optical activity under crossed polarization. Without being bound to any particular theory, the lack of optical activity of a material having an isotropic carbon microstructure may be a result of a randomized graphitic grain structure with grains smaller than the wavelength of visible light, or the lack of any graphitic structure of any consequence.

Based upon the foregoing description, it should now be apparent that the described substantially pure pyrolytic carbon, methods of producing pyrolytic carbon and uses thereof will carry out the objects set forth above. It is, therefore, to be understood that variations can be made to the specific process steps and starting materials described above without departing from the spirit of the invention as herein disclosed and described. Thus, the scope of the invention shall include all modifications and variations that fall within the scope of the claims.

I claim:

1. A process for producing substantially pure pyrolytic carbon comprising:
   providing inorganic particles having a surface area greater than about 10 $m^2/g$;
   exposing the inorganic particles to a hydrocarbon gas;
   heating the inorganic particles and hydrocarbon gas for a time sufficient to deposit a substantially uniform layer of carbon on the particles; and
   wherein the deposition of the substantially uniform layer of carbon on the inorganic particles results in high mass deposition per unit volume of inorganic particles.

2. The process of claim 1, wherein the surface area of the inorganic particles is greater than about 50 $m^2/g$.

3. The process of claim 1, wherein the diameter of the inorganic particles is less than about 1 micron.

4. The process of claim 3, wherein the diameter of the inorganic particles is less than about 0.5 micron.

5. The process of claim 3, wherein the diameter of the inorganic particles is less than about 0.1 micron.

6. The process of claim 3, wherein the diameter of the inorganic particles is less than about 0.05 micron.

7. The process of claim 1, wherein the length of the refractory inorganic particles is from about 3 to about 5000 microns.

8. The process of claim 7, wherein the length of the refractory inorganic particles is from about 5 to about 2000 microns.

9. The process of claim 7, wherein the length of the refractory inorganic particles is from about 5 to about 300 microns.

10. The process of claim 1, wherein the layer of carbon is deposited to a thickness of at least about five times greater than the smallest dimension of the particles.

11. The process of claim 1, wherein the layer of carbon is deposited to a thickness of at least about ten times greater than the smallest dimension of the particles.

12. The process of claim 1, wherein the refractory inorganic particles are selected from the group consisting of carbon particles and ceramic particles.

13. The process of claim 12, wherein the refractory inorganic particles are carbon particles.

14. The process of claim 13, wherein the carbon particles are selected from the group consisting of powders, particulates, whiskers and flakes.

15. The process of claim 14, wherein the carbon particles are carbon whiskers.

16. The process of claim 15, wherein the carbon whiskers are vapor grown carbon whiskers.

17. The process of claim 15, wherein the carbon whiskers are carbonized polymeric nanofibers.

18. The process of claim 15, wherein the carbon whiskers have a diameter less than about 1 micron.

19. The process of claim 18, wherein the carbon whiskers have a diameter less than about 0.2 micron.

20. The process of claim 18, wherein the carbon whiskers have a diameter less than about 0.05 micron.

21. The process of claim 12, wherein the refractory inorganic particles are ceramic particles.

22. The process of claim 21, wherein the ceramic particles are selected from the group consisting of powders, particulates, whiskers and flakes.

23. The process of claim 22, wherein the ceramic particles are ceramic whiskers.

24. The process of claim 23, wherein the ceramic whiskers are selected from the group consisting of alumina, silica, silicon carbide, silicon nitride, titanium carbide, titanium nitride, zirconia, ceria and glass whiskers.

25. The process of claim 24, wherein the ceramic whiskers are silicon carbide.

26. The process of claim 1, wherein the hydrocarbon gas is selected from the group consisting of natural gas, methane, ethane, propane, butane, acetylene, ethylene, propylene, butylene, benzene, and mixtures thereof.

27. The process of claim 26, wherein the hydrocarbon gas is natural gas.

28. The process of claim 1, wherein the mixture is heated at a temperature in the range of from about 500° C. to about 1700° C.

29. The process of claim 28, wherein the mixture is heated at a temperature in the range of from about 900° C. to about 1200° C.

30. The process of claim 1, wherein the process is carried out in a process vessel selected from the group consisting of a fluidized bed process vessel, entrained flow process vessel and a packed bed process vessel.

31. The process of claim 30, wherein the process is carried out in a packed bed process vessel and the hydrocarbon gas is flowed through the packed bed.

32. A substantially pure bulk pyrolytic carbon produced by the process of claim 1.

33. The substantially pure pyrolytic carbon of claim 32, wherein said pyrolytic carbon has at least one dimension less than about 10 microns.

34. The substantially pure pyrolytic carbon of claim 33, wherein said pyrolytic carbon has at least one dimension less than about 3 microns.

35. The substantially pure pyrolytic carbon of claim 32, wherein said pyrolytic carbon has a microstructure selected from the group consisting of rough laminar, smooth laminar and isotropic microstructures.

36. The substantially pure pyrolytic carbon of claim 32, wherein said carbon is amorphous.

37. The substantially pure pyrolytic carbon of claim 32, wherein the pyrolytic carbon is 99 weight percent carbon.

38. The substantially pure pyrolytic carbon of claim 32, wherein the pyrolytic carbon is 95 weight percent carbon.

39. A filler comprising the substantially pure pyrolytic carbon of claim 32.

40. A thermoplastic composition comprising the filler of claim 39.

41. An electrode comprising the filler of claim 39.

* * * * *